(12) United States Patent
Anderson et al.

(10) Patent No.: US 11,961,759 B2
(45) Date of Patent: Apr. 16, 2024

(54) INTERCONNECTS HAVING SPACERS FOR IMPROVED TOP VIA CRITICAL DIMENSION AND OVERLAY TOLERANCE

(71) Applicant: International Business Machines Corporation, Armonk, NY (US)

(72) Inventors: Brent A. Anderson, Jericho, VT (US); Lawrence A. Clevenger, Saratoga Springs, NY (US); Nicholas Anthony Lanzillo, Wynantskill, NY (US); Christopher J. Penny, Saratoga Springs, NY (US); Kisik Choi, Watervliet, NY (US); Robert Robison, Rexford, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 24 days.

(21) Appl. No.: 17/592,078

(22) Filed: Feb. 3, 2022

(65) Prior Publication Data

US 2022/0157652 A1 May 19, 2022

Related U.S. Application Data

(62) Division of application No. 16/861,292, filed on Apr. 29, 2020, now Pat. No. 11,295,978.

(51) Int. Cl.
*H01L 21/768* (2006.01)
*H01L 21/02* (2006.01)
(Continued)

(52) U.S. Cl.
CPC .. *H01L 21/76807* (2013.01); *H01L 21/02019* (2013.01); *H01L 21/02065* (2013.01);
(Continued)

(58) Field of Classification Search
CPC ............ H10N 70/066; H01L 21/76832; H01L 21/76834; H01L 21/76883;
(Continued)

(56) References Cited

U.S. PATENT DOCUMENTS 5,693,568 A 12/1997 Liu et al.
6,103,456 A 8/2000 Tobben et al.
(Continued)

OTHER PUBLICATIONS

Edelstein "20 Years of Cu BEOL in manufacturing, and its future prospects" 2017 IEEE International Electron Devices Meeting (IEDM). IEEE, Dec. 2017 (4 pages).
(Continued)

*Primary Examiner* — Galina G Yushina
(74) *Attorney, Agent, or Firm* — CANTOR COLBURN LLP; Daniel Yeates

(57) ABSTRACT

An interconnect structure for an integrated circuit includes a plurality of first-type interconnect elements and a second-type of interconnect element which directly contact an underlying first-type interconnect element. The second-type interconnect element extends along a first axis to define a horizontal length and along a second axis to define a vertical height. The second-type interconnect element and the first-type interconnect element define a conductive via comprising a metal material extending continuously along the second axis from a base of the underlying first-type interconnect element and stopping at the upper surface of the second-type interconnect element. The vertical height of the second-type interconnect element is greater than the vertical height of the first-type interconnect elements.

5 Claims, 2 Drawing Sheets

(51) Int. Cl.
  *H01L 23/522* (2006.01)
  *H01L 23/528* (2006.01)
  *H01L 27/146* (2006.01)
  *H10N 70/00* (2023.01)

(52) U.S. Cl.
  CPC ........ *H01L 23/5226* (2013.01); *H01L 23/528* (2013.01); *H01L 27/14636* (2013.01); *H10N 70/066* (2023.02); *H01L 2224/80004* (2013.01)

(58) Field of Classification Search
  CPC ....... H01L 2221/1063; H01L 21/76897; H01L 21/76807; H01L 21/02019; H01L 21/02065; H01L 23/5226; H01L 23/528; H01L 27/14636; H01L 45/1683; H01L 2224/80004
  See application file for complete search history.

(56) References Cited

U.S. PATENT DOCUMENTS

| | | |
|---|---|---|
| 6,187,666 B1 | 2/2001 | Singh et al. |
| 6,245,669 B1 | 6/2001 | Fu et al. |
| 6,291,334 B1 | 9/2001 | Somekh |
| 6,424,044 B1 | 7/2002 | Han et al. |
| 6,441,418 B1 | 8/2002 | Shields et al. |
| 7,030,010 B2 | 4/2006 | Farnworth et al. |
| 8,611,055 B1 | 12/2013 | Pakala et al. |
| 9,613,861 B2 | 4/2017 | Anderson et al. |
| 2001/0017757 A1* | 8/2001 | Abdul-Ridha ...... C23C 14/0036 361/311 |
| 2001/0048275 A1* | 12/2001 | Nakada ................... H01J 11/24 315/169.3 |
| 2002/0146915 A1 | 10/2002 | Narwankar et al. |
| 2015/0130073 A1* | 5/2015 | Sung .................. H01L 21/76877 438/666 |
| 2016/0308060 A1 | 10/2016 | Tanaka et al. |
| 2017/0005069 A1 | 1/2017 | Chen et al. |
| 2017/0135215 A1 | 5/2017 | Morshed |
| 2018/0061707 A1 | 3/2018 | Clevenger et al. |
| 2019/0225006 A1 | 7/2019 | Kohlmann et al. |
| 2019/0250121 A1 | 8/2019 | Ebata |
| 2019/0348322 A1* | 11/2019 | Mullick ............. H01L 21/76807 |
| 2019/0355621 A1* | 11/2019 | Marcadal ........... H01L 21/76834 |
| 2019/0378756 A1* | 12/2019 | Mullick ............. H01L 23/5226 |
| 2021/0343585 A1 | 11/2021 | Anderson et al. |

OTHER PUBLICATIONS

List of IBM Patents or Patent Applications Treated as Related; Date Filed: Feb. 3, 2022, 2 pages.

\* cited by examiner

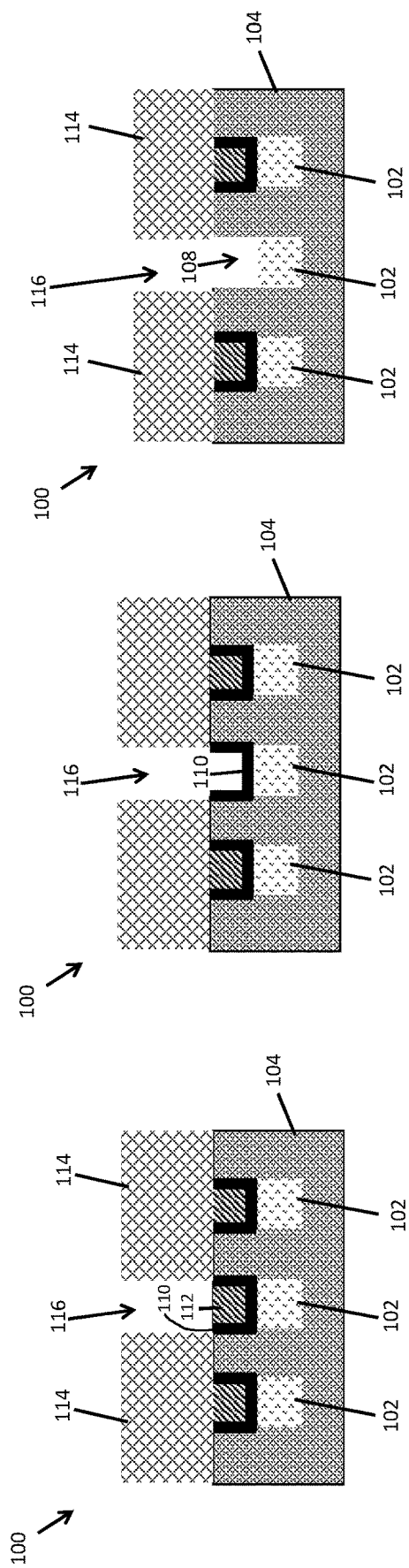
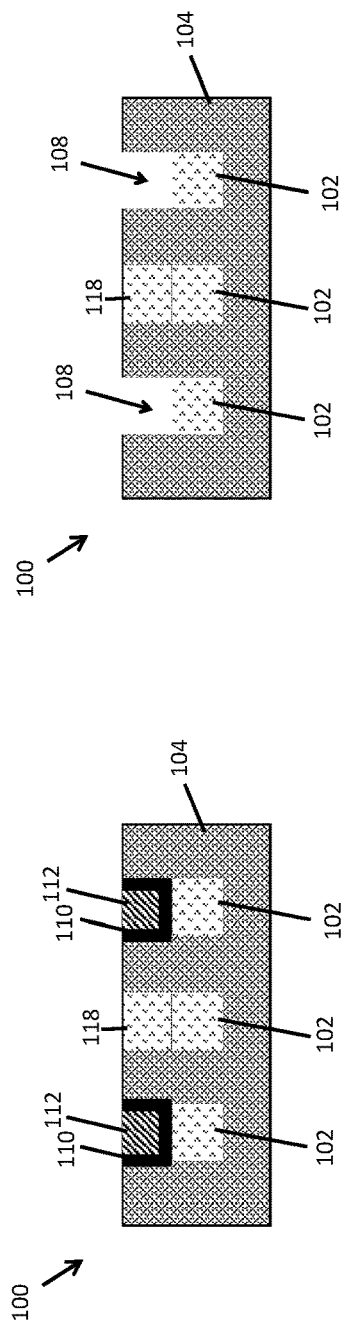

INTERCONNECTS HAVING SPACERS FOR IMPROVED TOP VIA CRITICAL DIMENSION AND OVERLAY TOLERANCE

BACKGROUND

The present invention generally relates to fabrication methods and resulting structures for integrated circuits (ICs), and more specifically, to fabrication methods and resulting interconnect structures included in ICs.

ICs (also referred to as a chip or a microchip) include electronic circuits on a wafer. The wafer is a semiconductor material, such as, for example, silicon or other materials. An IC includes a large number of individual devices formed on the wafer. The individual devices, such as transistors, capacitors, resistors, etc. are formed in earlier layers of the IC known as front-end-of-line (FEOL) layers.

The back-end-of-line (BEOL) is the stage of IC fabrication where conductive wiring interconnect networks are established to form interconnect structures that interconnect FEOL devices with one another. Typically, the wiring interconnect networks include two types of interconnect elements (often referred to as interconnects) that serve as electrical conductors, namely, conductive lines that traverse a distance across the chip, and conductive vias that connect the conductive lines at different levels (typically referred to as metallization layers). The conductive lines and conductive vias are made of conductive material, such as aluminum or copper, and are electrically insulated by interlayer dielectrics (ILD).

SUMMARY

A non-limiting example of an interconnect structure is provided. The interconnect structure includes a wafer extending along a first axis to define a horizontal wafer length and a second axis orthogonal to the first axis to define a vertical wafer height. A plurality of first-type interconnects is embedded in the wafer. Each first-type interconnect extends along the first axis to define a first horizontal length and along the second axis to define a first vertical height. A second-type interconnect embedded in the wafer and directly contact an underlying first-type interconnect among the plurality of first-type interconnects. The second-type interconnect extends along the first axis to define a second horizontal length and along the second axis to define a second vertical height. The second horizontal length being substantially equal to the first horizontal length. The interconnect structure further includes a sacrificial spacer liner on an upper surface of at least one remaining first-type interconnect among the plurality of first-type interconnects. A dielectric cap is on an upper surface of the sacrificial spacer liner.

Another non-limiting example of an interconnect structure is provided. The interconnect structure includes a wafer extending along a first axis to define a horizontal wafer length and a second axis orthogonal to the first axis to define a vertical wafer height. A plurality of first-type interconnects is embedded in the wafer. Each first-type interconnect extends along the first axis to define a first horizontal length and along the second axis to define a first vertical height. A second-type interconnect embedded in the wafer and directly contact an underlying first-type interconnect among the plurality of first-type interconnects. The second-type interconnect extending along the first axis to define a second horizontal length and along the second axis to define a second vertical height. The second horizontal length being substantially equal to the first horizontal length. The interconnect structure further includes at least one wafer trench formed in the wafer. The at least one wafer trench exposes one or more remaining first-type interconnect among the plurality of first-type interconnects. The wafer trench has a trench width equal to the first horizontal length the at least one remaining first-type interconnect.

A non-limiting example of a method for forming an interconnect structure is provided. The method includes forming a first trench such that a portion of the first trench is defined by a portion of a first-type of interconnect and depositing a sacrificial spacer liner in the first trench to cover the portion of the first-type of interconnect. The method further includes forming a dielectric cap on the sacrificial spacer liner and above the first-type of interconnect, removing the dielectric cap to expose at least a portion of the first-type of interconnect, and forming a second-type of interconnect on the exposed first-type of interconnect.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIGS. 1-9 depict cross-sectional views of a portion of an IC wafer after fabrication operations to form an interconnect structure according to one or more embodiments of the invention, in which:

FIG. 1 depicts a cross-sectional view of a portion of an intermediate interconnect structure including first-type interconnects formed in an IC wafer according to one or more embodiments of the invention;

FIG. 2 depicts a cross-sectional view of a portion of the interconnect structure after fabrication operations to recess a portion of the first-type interconnects to form trenches according to one or more embodiments of the invention;

FIG. 3 depicts a cross-sectional view of a portion of the interconnect structure after fabrication operations to deposit a sacrificial spacer liner in the trenches according to one or more embodiments of the invention;

FIG. 4 depicts a cross-sectional view of a portion of the interconnect structure after fabrication operations to fill the trenches with a dielectric fill material according to one or more embodiments of the invention;

FIG. 5 depicts a cross-sectional view of the portion of the interconnect structure after fabrication operations to pattern a masking layer according to one or more embodiments of the invention;

FIG. 6 depicts a cross-sectional view of the portion of the interconnect structure after fabrication operations to remove the dielectric fill material from above a targeted first-type interconnect according to one or more embodiments of the invention;

FIG. 7 depicts a cross-sectional view of the portion of the interconnect structure after removing a portion of the sacrificial spacer liner to expose the targeted first-type interconnect according to one or more embodiments of the invention;

FIG. 8 depicts a cross-sectional view of the portion of the interconnect structure after filling the trench with a conductive material to form a conductive via according to one or more embodiments of the invention; and FIG. 9 depicts a cross-sectional view of the portion of the interconnect structure after fabrication operations to remove the remaining sacrificial spacer liner and dielectric fill material according to one or more embodiments of the invention.

Figure 2:
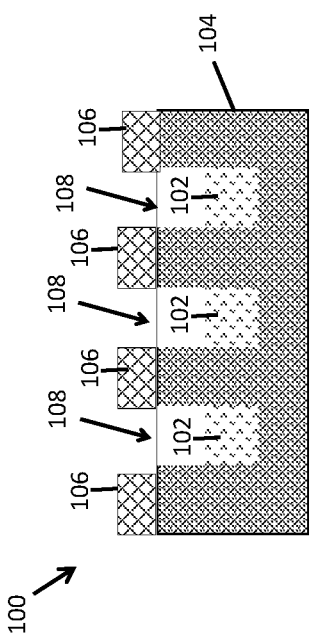

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the embodiments of the invention, the various elements illustrated in the figures are provided with two or three digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular interconnect architecture, embodiments of the invention are not limited to the particular interconnect architectures or materials described in this specification. Rather, embodiments of the present invention are capable of being implemented in conjunction with any other type of interconnect architecture or materials now known or later developed, wherein it is desirable to meet critical dimensions while providing overlay tolerances.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of S/D regions, as well as the deposition of metal contacts, can occur during the MOL stage to connect the elements patterned during the FEOL stage.

Layers of interconnections (e.g., metallization layers) can include one or more conductive lines and/or one or more conductive vias. The conductive lines are formed above the logical and functional layers during the BEOL stage to complete the IC. Most ICs need more than one metallization layer, and as many as 5-12 layers can be formed in the BEOL process. The various layers and/or individual conductive lines are interconnected by conductive vias. The combination of conductive lines and conductive vias form a wiring interconnect network that establishes the necessary connections of the interconnect structure.

Insulating dielectric materials are used throughout the layers of an IC to perform a variety of functions, including stabilizing the IC structure and providing electrical isolation of the IC elements. For example, one or more conductive lines in the BEOL region of the IC are isolated by dielectric layers to prevent the conductive lines from creating a short circuit. One or more conductive vias are typically formed in the higher-level dielectric layer to establish a connection between a conductive line formed at a first layer and another conductive line formed at a second layer.

The continued scaling of semiconductor devices has resulted in challenging fabrication requirements, especially when fabricating ever smaller conductive wiring interconnect networks using traditional dual damascene techniques. In particular, yielding traditional dual damascene vias is difficult at small dimensions due to the placement of the conductive via below the line trench. In addition, RC delay is a major bottleneck in achieving favorable device performance, caused by high capacitance and high resistance of narrow-pitch interconnects. At extremely tight pitches, the ability to properly align conductive vias to an underlying line trench is beyond the current tooling capabilities. For example, misalignments in the patterned via opening can result in lateral over-etching of the via trench, thereby inadvertently removing portions of the wafer. As a result, the subsequent filling of the via trench with a conductive metal forms a conductive via that is laterally misaligned with respect to the underlying conductive line.

One or more non-limiting embodiments of the invention described herein provides fabrication methods and resulting interconnect structures that employ a sacrificial spacer liner. In accordance with aspects of the invention, the sacrificial spacer line is configured and arranged to aid in aligning a top conductive via with an underlying line trench. Unlike known via formation schemes, implementation of the sacrificial spacer liner described herein allows a conductive via to be formed over a targeted conductive line with significantly improved alignment—even beyond what it currently possible with conventional alignment techniques. The sacrificial spacer liner protects inadvertent removal of the wafer when forming the via trench, even when the patterned via trench opening is misaligned with respect to the underlying conductive line. Accordingly, the dimensions of the top conductive via can be confined by the sacrificial spacer liner to enhance the overlay and alignment of the top conductive via with the underlying conductive line while maintaining a targeted via critical dimension (CD).

Figure 1:
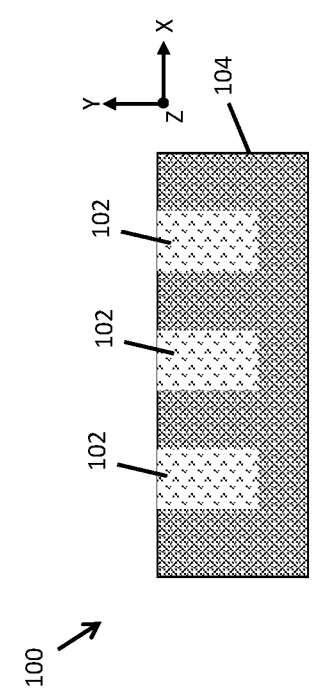

With reference now to FIG. 1, an intermediate IC structure 100 is illustrated according to well-known BEOL fabrication techniques. In the present specification and claims, an "intermediate" IC structure is defined as an IC structure in a stage of fabrication prior to a final stage. The IC structure 100 includes a substrate 104 configured and arranged to extend along a first axis (e.g., an X-axis) to define a horizontal length, a second axis (e.g., a Y-axis) orthogonal to the first axis to define a vertical height, and a third axis (e.g., a Z-axis) orthogonal to the first and second axes to define a width. The substrate 104 is multi-layered, and integrated within the substrate 104 are FEOL layers, MOL layers, and BEOL layers.

The BEOL layers of the substrate 104 includes one or more first-type interconnect elements (referred to as first-type interconnects) 102 formed therein, i.e., embedded in the BEOL layers of the substrate 104. Although the first-type interconnects 102 are described as conductive lines going forward, it should be appreciated that one or more conductive vias (not shown in FIG. 1) can be formed in the substrate 104 without departing from the scope of the invention. The conductive lines 102 extend along the first axis to define a horizontal line length, the second axis to define a vertical line height, and a third axis to define a line width.

The substrate 104 can include a single crystalline semiconductor material or a polycrystalline material. In another embodiment of the invention, the substrate 104 can include an elemental semiconductor material such as silicon (Si) or germanium (Ge), a semiconductor material primarily composed of Group IV elements such as a silicon-germanium alloy or a silicon-carbon alloy, a III-V compound semiconductor material, a II-VI compound semiconductor material, or an organic semiconductor material.

In one or more non-limiting embodiments of the invention, the substrate 104 can include undoped single crystalline silicon or single crystalline silicon doped with p-type dopant atoms or n-type dopant atoms. Examples of materials for the substrate 104 include, but are not limited to, silicon, germanium, diamond, silicon germanium, silicon carbide, gallium arsenic, indium arsenide, indium phosphide, silicon germanium carbide, gallium arsenic phosphide, gallium indium phosphide, combinations of these, or any other suitable semiconductor material(s).

The conductive lines 102 can be formed using standard lithography and patterning techniques. For example, wafer openings (not shown) can be etched into substrate 104, then subsequently filled with a conductive material to form the conductive lines 102 as shown in FIG. 1. Example materials of the conductive material used to form the conductive lines 102 include, but are not limited to, copper (Cu), aluminum (Al), tungsten (W), tungsten cobalt (WCo), ruthenium (Ru), nickel (Ni), etc. In one or more embodiments of the invention, the wafer openings can be overfilled such that an excess amount of the conductive material is formed on an upper surface of the substrate 104. Thereafter, a chemical mechanical polishing/planarization (CMP) can be performed remove the excess conductive material is formed on an upper surface of the substrate 104. Accordingly, the upper surface of the resulting conductive lines 102 are formed flush (i.e., co-planar) with the upper surface of the substrate 104 as further illustrated in FIG. 1. Although not shown for conciseness, the first-type interconnects 102 can be operatively coupled to the devices as understood by one skilled in the art Turning to FIG. 2, the IC structure 100 is illustrated after recessing a portion of the conductive lines 102. In one or more non-limiting embodiments of the invention, a hardmask 106 is formed on an upper surface of the substrate 104. The hardmask 106 can be formed from various hardmask materials such as, for example, silicon nitride (SiN), which serves to protect the underlying substrate 104. The hardmask 106 can be patterned using know lithography and patterning techniques to form openings that expose the upper surface of the conductive lines 102. An etching process such as a reactive ion etch (RIE), for example, can be performed that recesses the conductive lines 102 while the remaining portions of the hardmask 106 protect the substrate 104. Accordingly, the conductive lines 102 are partially recessed so as to form wafer trenches 108 in the substrate 104. The wafer trenches 108 extend horizontally (i.e., along the X-axis) between opposing sidewalls to define a trench width. The trench width of each wafer trench 108 is equal to, or substantially equal to, the width of its underlying conductive line 102.

Figure 3:
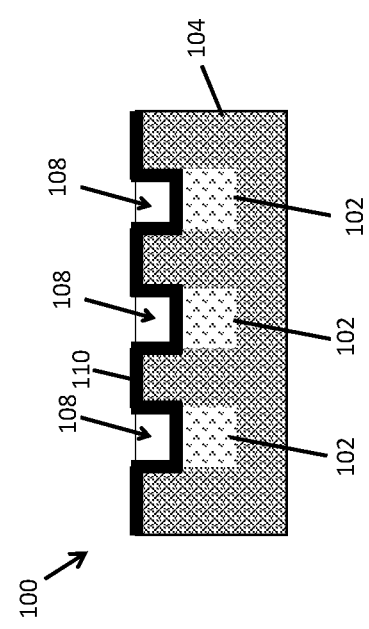

Turning to FIG. 3, the IC structure 100 is illustrated after depositing a sacrificial spacer liner 110 in the wafer trenches 108. According to one or more non-limiting embodiments of the invention, the sacrificial spacer liner 110 is conformal deposited so as to form a base that directly contacts an upper surface of an underlying conductive lines 102 and opposing sidewalls extending vertically from the base and directly contacting sidewalls of a surrounding trench 108. A reduced opening of the trench 108 is still present, however, to provide a fill area capable of receiving a fill material (not shown in FIG. 3).

The sacrificial spacer liner 110 can be made of, for example, a high-k material. The sacrificial spacer liner 110 servers to preserve the trench width of the initially formed wafer trench 108 and thus alignment with the underlying conductive line 102 even when a via opening (not shown in FIG. 3) formed later in the fabrication process is inadvertently misaligned, e.g., off-set laterally with respect to the underlying conductive line 102.

As used herein, high-k materials are those having a large dielectric constant relative to silicon dioxide, i.e., more than about 3.9, and preferably more than about 7.0. For example, the high-k materials can include, but are not limited to, aluminum nitride (AlN) and hafnium oxide ($HfO_2$). The thickness of the sacrificial spacer liner 110 can range, for example, from about 1 nanometer (nm) to about 10 nm. In one or more non-limiting embodiments of the invention, the sacrificial spacer liner 110 is formed directly on an upper surface of the dielectric layer 104 and lines the sidewalls of the trench and upper surface of the conductive lines 102 using, for example, an atomic layer deposition (ALD) process or a flowable chemical vapor deposition (CVD) process.

Figure 4:
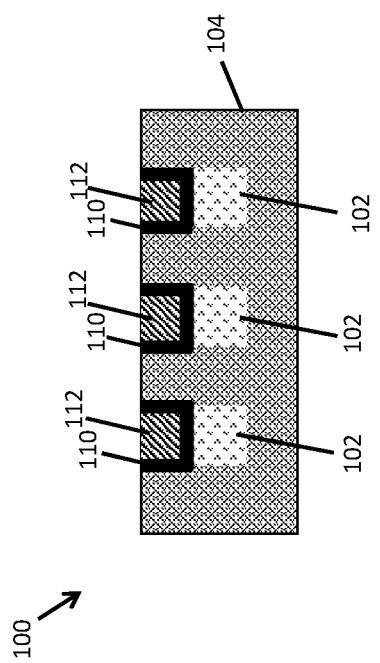

Referring to FIG. 4, the IC structure 100 is illustrated after filling the wafer trenches 108 with a dielectric fill material to form individual dielectric caps 112 according to one or more embodiments of the invention. The material of the dielectric caps 112 can include a low-k dielectric material (e.g., materials having a small dielectric constant relative to silicon dioxide, i.e., less than about 3.9), porous silicates, carbon doped oxides, silicon dioxides, silicon nitrides, silicon oxynitrides, silicon carbide (SiC), or other dielectric materials. Any known manner of depositing the dielectric fill material in the wafer trenches 108 can be utilized, such as, for example, CVD, PECVD, ALD, flowable CVD, spin-on dielectrics, or PVD. In one or more embodiments of the invention, the wafer trench 108 (shown in FIG. 3) is overfilled above a surface of the substrate 104, forming overburdens that can be removed using, for example, a CMP process. Accordingly, the upper surface of the dielectric fill material 112 can be formed flush (i.e., co-planar) with respect to remaining portions of the sacrificial spacer liner 110 and the upper surface of the substrate 104 to form the dielectric caps 112 as shown in FIG. 4.

Turning to FIG. 5, the IC structure 100 is illustrated after patterning a masking layer 114 formed on the upper surface of the substrate 104 according to one or more embodiments of the invention. The masking layer 114 can be formed from various hardmask materials such as, for example, SiN. The hardmask 106 can be patterned using know lithography and patterning techniques to form one or more openings 116 that expose an underlying dielectric cap 112.

With reference to FIG. 6, the IC structure 100 is illustrated after removing the exposed dielectric cap 112 from above a targeted conductive line 102 according to one or more embodiments of the invention. In one or more non-limiting embodiments of the invention, the dielectric cap 112 is removed using a wet etch process. In some embodiments of the invention, the dielectric cap 112 is removed selective to the sacrificial spacer liner 110. In one or more embodiments of the invention, an etching chemistry including Potassium Hydroxide (KOH) can be used to remove the dielectric cap 112. Accordingly, the underlying sacrificial spacer liner 110 is exposed as further shown in FIG. 6. Unlike conventional fabrication processes, the sacrificial spacer liner 110 prevents laterally over-etching portions of the wafer 104 when removing the exposed dielectric cap 112. In this manner, lateral misalignment of the conductive via (not shown in FIG. 6) formed at later stages of the fabrication process can be avoided.

Turning to FIG. 7, the IC structure 100 is illustrated after removing the sacrificial spacer liner 110 to re-open the wafer trench 108 and expose the underlying targeted conductive line 102. By employing the sacrificial spacer liner 110 during removal of the dielectric cap 112, the re-wafer trench 108 maintains its initial trench width. Accordingly, the trench width of the re-opened wafer trench 108 is equal to, or substantially equal to, the width of the underlying conductive line 102. In other words, the re-opened wafer trench 108 is fully aligned with the underlying conductive line 102.

In one or more non-limiting embodiments of the invention, the sacrificial spacer liner 110 is removed using a wet etch, a dry etch, or a combination of sequential wet and/or dry etches. In some embodiments of the invention, the sacrificial spacer liner 110 is removed selective to the underlying conductive line 102 and the substrate 104. In one or more embodiments of the invention, an etching chemistry including hydrogen bromide (HBr) can be used to etch the sacrificial spacers 110 selective to the underlying conductive line 102 and the substrate 104. Accordingly, the opening 116 and re-opened wafer trench 108 expose the upper surface of the targeted conductive line 102 as further shown in FIG. 7.

Referring now to FIG. 8, the IC structure 100 is illustrated after depositing a conductive material directly on the upper surface of the targeted conductive line 102. In one or more non-limiting embodiments of the invention, the conductive material can be deposited on the targeted conductive line 102 without being deposited on the remaining conductive lines because they are covered by the masking layer 114. In one or more non-limiting embodiments of the invention, the conductive material includes, but is not limited to, copper or a non-copper metal (e.g., tungsten, titanium, tantalum, ruthenium, zirconium, cobalt, aluminum, platinum), alloys thereof, conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the conductive material matches the material of the underlying conductive line 102. In some embodiments of the invention, however, the conductive material deposited in the opening 116 and the conductive line 102 are made of different conductive materials.

In some embodiments of the invention, the opening 116 is overfilled above a surface of the masking layer 114, forming overburdens (not shown) that can be removed using, for example, a CMP process. Accordingly, the upper surface of the conductive material can be formed flush (i.e., co-planar) with respect to the upper surface of the substrate 104 to form a second-type interconnect element 118 (referred to as a second-type interconnect). The second-type interconnect 118 includes, for example, a conductive via 118. In one or more embodiments of the invention, the conductive via 118 extends vertically from the underlying conductive line and stops at the upper surface of the substrate 104 such that it extends above the remaining adjacent conductive lines 102. Unlike a dual damascene integration scheme or a typical tip via scheme used to form vias, the fabrication method according to non-limiting embodiments of the invention allows the conductive via 118 to be formed on the underlying conductive line 102 with significantly improved alignment.

The conductive material used to form the conductive via 118 can be a metal material including, but not limited to, copper (Cu), aluminum (Al), tungsten (W), tungsten cobalt (WCo), ruthenium (Ru), nickel (Ni), etc. In some embodiments of the invention, the metal material used to form the conductive via 118 is the same metal material used to form the conductive lines 102. In other embodiments of the invention, the metal material used to form the conductive via 118 is different from the metal material used to form the conductive lines 102.

An optional fabrication operation shown in FIG. 9 can be performed to remove the remaining dielectric caps 112 and sacrificial spacer liners 110. In one or more non-limiting embodiments of the invention, the dielectric caps 112 and sacrificial spacer liners 110 can be removed using a wet etch, a dry etch, or a combination of sequential wet and/or dry etches. In some embodiments of the invention, the dielectric caps 112 and sacrificial spacer liners 110 are removed selective to the conductive via 118, the conductive lines 102, and the substrate 104. In other embodiments of the invention, a masking layer (not shown) formed on an upper surface of the wafer 104 can be patterned to expose the remaining dielectric caps 112 and sacrificial spacer liners 110 while covering the conductive via 118, and one or more etching processes can be performed to remove the remaining dielectric caps 112. In either case, the wafer-trench 108 are re-opened to expose the remaining conductive lines 102 as further shown in FIG. 9.

As described above, the sacrificial spacer liners 110 removed from the wafer trenches 108 served to preserve the trench width. Accordingly, the trench width of each re-opened wafer trench 108 is equal to, or substantially equal to, the width of its underlying conductive line 102. In one or more embodiments of the invention, the re-opened wafer trenches 108 can be filled with a dielectric material (e.g., an ILD) or a conductive material during later stages of the process flow (not shown).

Various non-limiting embodiments of the invention described herein provide an interconnect structure that employs a sacrificial spacer liner that aids in aligning a top conductive via with an underlying line trench. The sacrificial spacer liner prevents unintentionally removing portions of the wafer when forming a line/via trench, even when the patterned via trench opening is misaligned with respect to the underlying interconnect (e.g., conductive line or conductive via). Accordingly, the dimensions of the top conductive via can be confined by the sacrificial spacer liner to enhance the overlay and alignment of the top conductive via with the underlying conductive interconnect while maintaining a targeted via critical dimension (CD).

Terms such as "epitaxial growth" and "epitaxially formed and/or grown" refer to the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An interconnect structure for an integrated circuit comprising:
    a wafer including a plurality of trenches, the wafer extending along a first axis to define a horizontal wafer length and a second axis orthogonal to the first axis to define a vertical wafer height;
    a plurality of first-type interconnect elements embedded in the wafer, each of the first-type interconnect elements in a respective trench among the plurality trenches and directly contacting sidewalls of the respective trench, and each of the first-type interconnect elements extending along the first axis to define a first horizontal length and along the second axis to define a first vertical height;
    a second-type interconnect element embedded in the wafer and in a corresponding trench among the plurality of trenches, the second-type of interconnect element directly contacting an underlying first-type interconnect element among the plurality of first-type interconnect elements and directly contacting sidewalls of the corresponding trench, the second-type interconnect element extending along the first axis to define a second horizontal length and along the second axis to define a second vertical height, the second horizontal length being substantially equal to the first horizontal length;
    wherein the interconnect structure includes the second-type interconnect element that directly contacts the underlying first-type interconnect element, the second-type interconnect element and the first-type interconnect element defining a conductive via comprising a metal material extending continuously along the second axis from a base of the underlying first-type interconnect element and stopping at the upper surface of the second-type interconnect element,
    wherein the plurality of first-type interconnect elements are formed from a single metal material, and the second-type interconnect element formed from a single metal material, and
    wherein an upper surface of the wafer is completely and each of the respective trench containing the first-type of interconnect element is not completely filled such that it exposes an upper surface of the first-type of interconnect element,
    wherein the second vertical height is greater than the first vertical height.

2. The interconnect structure for an integrated circuit of claim 1, wherein the conductive via extends along the second axis higher than the at least one remaining first-type interconnect element.

3. The interconnect structure for an integrated circuit of claim 1, wherein the plurality of first-type interconnect elements comprise a first-type of metal material.

4. The interconnect structure for an integrated circuit of claim 3, wherein the second-type interconnect element comprises a second-type of metal material that is the same as the first-type of metal material.

5. The interconnect structure for an integrated circuit of claim 3, wherein the second-type interconnect element comprises a second-type of metal material that is different from the first-type of metal material.

* * * * *